US008563354B1

(12) United States Patent
Morel (10) Patent No.: US 8,563,354 B1
(45) Date of Patent: Oct. 22, 2013

(54) ADVANCED 2-STEP, SOLID SOURCE DEPOSITION APPROACH TO THE MANUFACTURE OF CIGS SOLAR MODULES

(75) Inventor: Don Morel, Tampa, FL (US)

(73) Assignee: University of South Florida, Tampa, FL (US)

( * ) Notice: Subject to any disclaimer, the term of this patent is extended or adjusted under 35 U.S.C. 154(b) by 24 days.

(21) Appl. No.: 13/253,442

(22) Filed: Oct. 5, 2011

Related U.S. Application Data (60) Provisional application No. 61/389,943, filed on Oct. 5, 2010.

(51) Int. Cl.
*H01L 31/04* (2006.01)

(52) U.S. Cl.
USPC .............................................. 438/95; 136/256

(58) Field of Classification Search
None
See application file for complete search history.

(56) References Cited

U.S. PATENT DOCUMENTS

| | | | |
|---|---|---|---|
| 4,915,745 A | 4/1990 | Pollock et al. | |
| 5,045,409 A | 9/1991 | Eberspacher et al. | |
| 5,137,835 A | 8/1992 | Karg | |
| 5,141,564 A | 8/1992 | Chen et al. | |
| 5,436,204 A | 7/1995 | Albin et al. | |
| 5,477,088 A | 12/1995 | Rockett et al. | |
| 5,871,630 A | 2/1999 | Bhattacharya et al. | |
| 6,048,442 A * | 4/2000 | Kushiya et al. | 204/192.28 |
| 6,117,703 A | 9/2000 | Penndorf | |
| 6,258,620 B1 * | 7/2001 | Morel et al. | 438/57 |
| 6,281,036 B1 | 8/2001 | Niki et al. | |
| 6,974,976 B2 | 12/2005 | Hollars | |
| 7,544,884 B2 | 6/2009 | Hollars | |
| 8,198,123 B2 * | 6/2012 | Britt et al. | 438/95 |
| 2003/0230338 A1 | 12/2003 | Menezes | |
| 2004/0206390 A1 | 10/2004 | Bhattacharya | |
| 2005/0215079 A1 | 9/2005 | Taunier et al. | |
| 2006/0204659 A1 | 9/2006 | Choi | |
| 2007/0257255 A1 | 11/2007 | Dhere et al. | |
| 2008/0092954 A1 * | 4/2008 | Choi | 136/262 |

(Continued)

FOREIGN PATENT DOCUMENTS

| | | | |
|---|---|---|---|
| CN | 101740660 A * | 6/2010 | C03C 17/36 |
| WO | 2004032189 | 4/2004 | |
| WO | 2007120776 | 10/2007 | |

OTHER PUBLICATIONS

K. Jayadevan, R. Anders, S. Zafar, C. S. Ferekides, D. L. Morel, "Selenization Pathways to 2SSS CIGS Manufacturing" Sep. 10, 2012 IEEE p. 003460-003465.*

(Continued)

*Primary Examiner* — Telly Green
*Assistant Examiner* — Damian A Hillman
(74) *Attorney, Agent, or Firm* — Andriy Lytvyn; Smith & Hopen, P.A.

(57) ABSTRACT

A novel 2 step solid source deposition (2SSS) method to form an absorber layer in the manufacture for CIGS solar modules. 2-step refers to a first step of deposition of metals followed by second step of selenization of the metal stack. Metals are first deposited and then selenized in an adjacent chamber. Differential pumping is used to control egress of Se vapor into the sputtering region and prevent contamination of the targets. Products made by the method demonstrate comparable quality and performance to those produced by current processing techniques. The 2SSS method provides means for attaining improved uniformity of large area films which improves yield and cost-effectiveness.

13 Claims, 5 Drawing Sheets

(56) References Cited

U.S. PATENT DOCUMENTS

| | | |
|---|---|---|
| 2009/0139573 A1 | 6/2009 | Ramasesha et al. |
| 2009/0145746 A1 | 6/2009 | Hollars |
| 2009/0215224 A1 | 8/2009 | Li et al. |

OTHER PUBLICATIONS

Basol, B.; Kapur, V.; Halani, A.; Leidholm, C.; Minnick, A. Novel Two-Stage Selenization Methods for Fabrication of Thin-Film CIS Cells and Submodules. Final Subcontract Report, Mar. 1, 1993-Mar. 31, 1995. National Renewable Energy Laboratory, Golden, Colorado. Jun. 1995.

Ramanathan, K.; Bhattacharya, R.; Contreras, M.; Keane, J.C.; TO, B.; Dhere, R.G.; Noufi, R. High Performance CIGS Thin Film Solar Cells: A Laboratory Perspective. Conference Paper Presented at the 2005 DOE Solar Energy Technologies Program Review Meeting on Nov. 7-10, 2005, Denver, Colorado. National Renewable Energy Laboratory.

Park, J.W.; Choi, Y.W.; Lee, E.; Joo, O.S.; Yoon, S.; Min, B.K. Synthesis of CIGS absorber layers via a paste coating. Journal of Crystal Growth 311, 2009, pp. 2621-2635.

Kaelin, M.; Rudmann, D.; Kurdesau, F.; Zogg, H.; Meyer, T.; Tiwari, A.N. Low-cost CIGS solar cells by paste coating and selenization. Thin Solid Films 480-481, 2005, pp. 486-490.

Ganchev, M.; Kios, J.; Kaelin, M.; Bereznev, S.; Tzvetkova, E.; Volobujeva, O.; Stratieva, N.; Tiwari, A. Preparation of Cu(In,Ga)Se2 layers by selenization of electrodeposited Cu-In-Ga precursors. Thin Solid Films 511-512, 2006, pp. 325-327.

Wada, T.; Nishiwaki, S.; Hashimoto, Y.; Negami, T. Physical Vapor Deposition of Cu(In,Ga)Se2 Films for Industrial APplication. Mat. Res. Soc. Proc. vol. 668, 2001.

Cunha, A.F.; Kurdzesau, F.; Salome, P.M.P. Cu(In,Ga)Se2 prepared by a 2 and 3-Stage Hybrid RF-Magnetron Sputtering and Se Evaporation Method: Properties and Solar Cell Performance. Materials Science Forum vols. 514-516, May 2006, pp. 93-97.

\* cited by examiner

ADVANCED 2-STEP, SOLID SOURCE DEPOSITION APPROACH TO THE MANUFACTURE OF CIGS SOLAR MODULES

CROSS REFERENCE TO RELATED APPLICATIONS

This application claims priority to U.S. Provisional Patent Application 61/389,943, entitled, "Layered Selenization Approach to the Manufacture of CIGS Solar Modules", filed Oct. 5, 2010, the contents of which are herein incorporated by reference.

FIELD OF INVENTION

This invention relates to copper indium gallium diselenide (CIGS) solar modules. More particularly, the invention relates to a manufacturing process for CIGS solar modules.

BACKGROUND OF THE INVENTION

Current trends suggest solar energy will play an important role in future energy production. Silicon has been and remains the traditional solar cell material of choice. While silicon is a highly abundant material, it requires an energy intensive process to purify and crystallize. Furthermore, installations of silicon cells require heavy glass protection plates, which reduce residential applications. Recently, commercial interest is beginning to shift towards thin film cells. Material, manufacturing time, and weight savings are driving the increase in thin films. CIGS solar cells have the highest efficiency among thin film technologies.

CIGS thin film solar cells have achieved an efficiency of over 20% in the laboratory. Several companies have attempted to scale-up and commercialize the technology, but none has yet made a significant impact. The difficulty has been developing a viable manufacturing process. There are two leading technologies that are being pursued: co-deposition which has produced the record lab cell efficiencies, and the two-step process of depositing a metal precursor containing the entire thickness of metals and then selenizing it. There are several variations in the latter process including use of $H_2Se$ gas or evaporated Se as the selenizing agent, and deposition of the precursor by physical vapor deposition, electroplating or from an "ink" bearing liquid. While many factors come into play, a simplistic overview is that the co-deposition process is difficult to control in large areas, and the selenization processes are slow. A particular difficulty with the co-deposition process is that the established technology for coating large areas in a manufacturing environment is sputtering. While the metals can be sputtered, sputtering Se at the required rates is a challenge. Efforts to sputter the metals in the presence of a Se vapor provided by an evaporation source have resulted in poisoning of the metal targets. A combination of sputtering for the metals and evaporation for Se may overcome this difficulty. However, sputtering and evaporation are most effective in different pressure regimes, which make them difficult to use in the manufacturing process. Furthermore, Se is known to permeate the deposition environment and interfere with the sputtering tool.

The best co-deposited films are made with either a 2-step or 3-step process. In the 2-step process, a first layer is deposited which is basically a Cu-rich layer of Cu, Ga and Se, and could contain a small amount of In. The role of this layer is to form an initial large grain structure to propagate the growth of large grains for the finished $CuInGaSe_2$ film. The film is grown at a substrate temperature of about 300° C. which fosters the growth of binary phases. Under typical conditions the predominant phases are $Ga_2Se_3$ and $Cu_3Se_2$. For equal numbers of the binaries Ga2Se3 and Cu3Se2, the Cu/Ga ratio is 1.5, and the Se content is 50%. Other Cu phases can form depending on the Se flux. CuSe and $Cu_2Se$ can also form. While $Ga_2Se_3$ remains the dominant phase for Ga under most conditions, $Ga_2Se$ can form under low Se flux as well. This compound is volatile and results in loss of Ga from the film. To prevent this, high Se fluxes are typically used, but this is wasteful of Se. One then must attempt to tune the conditions to produce the desirable film while maximizing the tradeoff in Ga and Se waste. In the 3-step process the first step is deposition of a Group III-VI compound, usually $Ga_xSe_y$. Cu is not used in the first step because the III-VI selenides form a smooth and dense surface which improves overall film uniformity and yield. In the second step the Cu is added to accomplish the Cu-rich larger grain growth, and the proper quantities of all three metals are added in the third step to result in desired metal ratios for the finished film. These steps also provide means of grading the Ga composition.

Deposition technologies that can match the performance of small area CIGS cells in large areas and production volumes are needed. The best small area cells are made by co-evaporation of the constituent elements. However, it has been difficult to use this approach in commercial production because there are no suitable large area production viable evaporation tools as discussed above.

In summary, the highest efficiency achieved for CIGS solar cells involves a multi-step co-deposition process that is difficult to scale up to a viable manufacturing process. Alternative deposition approaches that are easier to manufacture do not attain the performance level of the multi-step co-deposition process. Consequently, the commercialization of CIGS technology lags that of other thin film technologies despite its higher demonstrated efficiency in the laboratory.

SUMMARY OF THE INVENTION

The present invention provides a technique for the manufacture of high performance, low cost CIGS solar modules. The preferred technique is to use sputtering for the metals and evaporation for Se, and to locate the sources in adjacent chambers. The acronym for the novel process is 2SSS which stands for "2-step solid source". The 2-step process comprises step 1 involving deposition of metals, followed by step 2, which involves selenization of the metal stack. To form the Cu-rich CGS layer according to the 2-step process using 2SSS, Cu and Ga metals are deposited first (2SSS step 1) and are then selenized (2SSS step 2). This is to be contrasted with the conventional 2-step process of co-depositing Cu, Ga and Se in step 1.

In summary, the method to form an absorber layer in the manufacture of CIGS solar modules, comprising the steps of: providing a substrate or superstrate; heating the substrate or superstrate to a desired temperature; depositing at least one metal layer containing Cu, In and Ga in a first deposition zone; exposing the metal layer to a source of Se to selenize the film to a desired level; and repeating steps of depositing metal layer and exposing the metal layer to Se source until a desired thickness and composition are attained.

Key design includes differential pumping, which can control egress of Se vapor into the sputtering region to prevent contamination of the targets. In this arrangement metals are first deposited and then selenized in an adjacent chamber. This is done in a layer by layer sequence until the desired film thickness is attained.

Cost and performance projections for this CIGS manufacturing technology employing multiple sequential deposition chambers indicate that capital cost contributions of less than $0.1/Watt can be attained in large volume manufacturing. This enables a module manufacturing cost of less than $0.50/Watt which is less than current manufacturing technologies.

BRIEF DESCRIPTION OF THE DRAWINGS

For a fuller understanding of the invention, reference should be made to the following detailed description, taken in connection with the accompanying drawings, in which.

DETAILED DESCRIPTION OF THE PREFERRED EMBODIMENT

Figure 1:
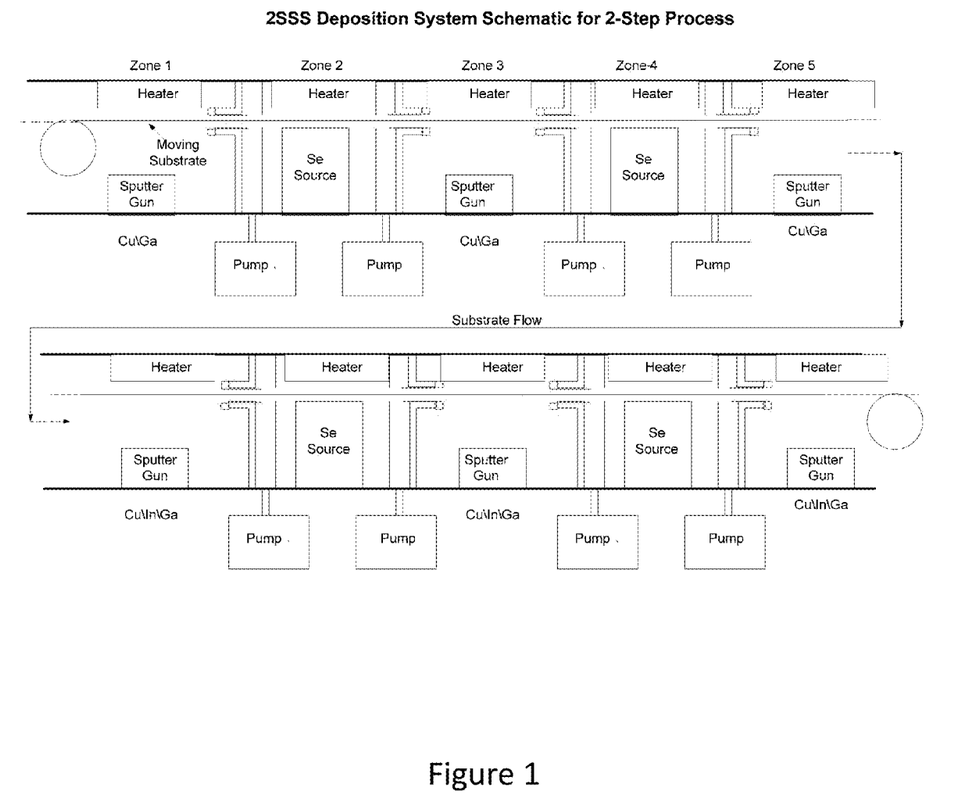
FIG. 1 is an illustration a method to manufacture CIGS solar modules.

The present invention provides a method called 2-Step, Solid Source (2SSS) processing, as shown in FIG. 1, to overcome the limitations of the prior art.

The invention is a novel method for the deposition of the absorber layer which can be CIGS or any suitable alloy of the I-III-VI$_2$ family of compounds including compounds such as CuZnSnSe$_2$ which use more earth abundant elements in place of In and or Ga. The platform can be either of the substrate or superstrate variety of any material including glass, stainless steel and other metal foils or polyimide or any other flexible material capable of supporting the film. In the most common substrate configuration a metal contact such as Mo is first deposited on the substrate. The absorber layer is then deposited on the Mo/substrate as it passes through the deposition chamber as illustrated in FIG. 1. One specific embodiment for the invented method in a 2-step process would be as follows:

1. Preheat the substrate to a temperature of about 300° C. In an alternative embodiment, the substrate is preheated to a temperature of about 275° C.
2. Deposit a thin layer of Cu and Ga in the first deposition zone of the deposition system. This can be done by sputtering from a single target of Cu and Ga or using two targets containing Cu and Ga in desired proportions.
3. While maintaining the temperature at about 300° C. (or 275° C.), move the substrate into the second zone in the deposition system and expose the metal layer to Se flux at such a rate to selenize the layer.
4. Move the substrate to the next deposition zone and repeat steps 2 and 3. This process is repeated until the CuGaSe layer reaches the desired thickness. In a preferred embodiment this film will be Cu-rich.
5. Once the CuGaSe layer is completed, heat the substrate to about 550° C. while moving it to the next deposition zone. In an alternative embodiment, the substrate is heated to a temperature of about 530° C.
6. In this zone deposit a thin layer of Cu In and Ga in suitable proportions to achieve the desired stoichiometry in the completed absorber layer. Electronic quality films typically have 0.8≤Cu/Group III≤1.0. As in step 2 the metals can be deposited from single or multiple targets containing Cu, In and Ga.
7. While maintaining the temperature at about 550° C. (or 530° C.), move the substrate into the next zone in the deposition system and expose the growing film to Se flux at such a rate to selenize the unreacted metals in the layer.
8. Move the substrate to the next zone and repeat steps 6 and 7 and continue to repeat this process until the necessary number of layers is deposited to attain the desired thickness and stoichiometry of the absorber layer.
9. Following the deposition steps the film is then subjected to a suitable temperature profile including cool down to optimize its properties. During this period the film may be exposed to additional Se flux at suitable levels to preserve its integrity.
10. Device completion layers are then deposited on the absorber layer to result in the formation of a junction and electrode for extracting power. Commonly used materials for this purpose are CdS and ZnO.

In the steps described above, Group II, III and IV, elements such as Zn and Sn can be substituted for or used in addition to In and Ga. Other Group VI elements, such as S, can be substituted for or used in addition to Se.

The above steps refer to the formation of the absorber layer which is the subject of the invention. There are many possible configurations for the finished solar cells and modules in the preparation of the substrate or superstrate, the manner of formation of the junction forming materials, the transparent contact layers and current collection constructs. For example, in the case of processing a monolithically integrated module there would be patterning steps inserted at appropriate points in the film deposition sequence. The deposition of the absorber layer using the method of the invention can be utilized in any of these approaches.

The viability of the 2SSS processes hinges on two key issues: 1. Demonstrating that films and devices of comparable quality and performance to those produced by current processing can be realized, and 2. Demonstrating that the 2SSS process is cost-effective.

Figure 5:
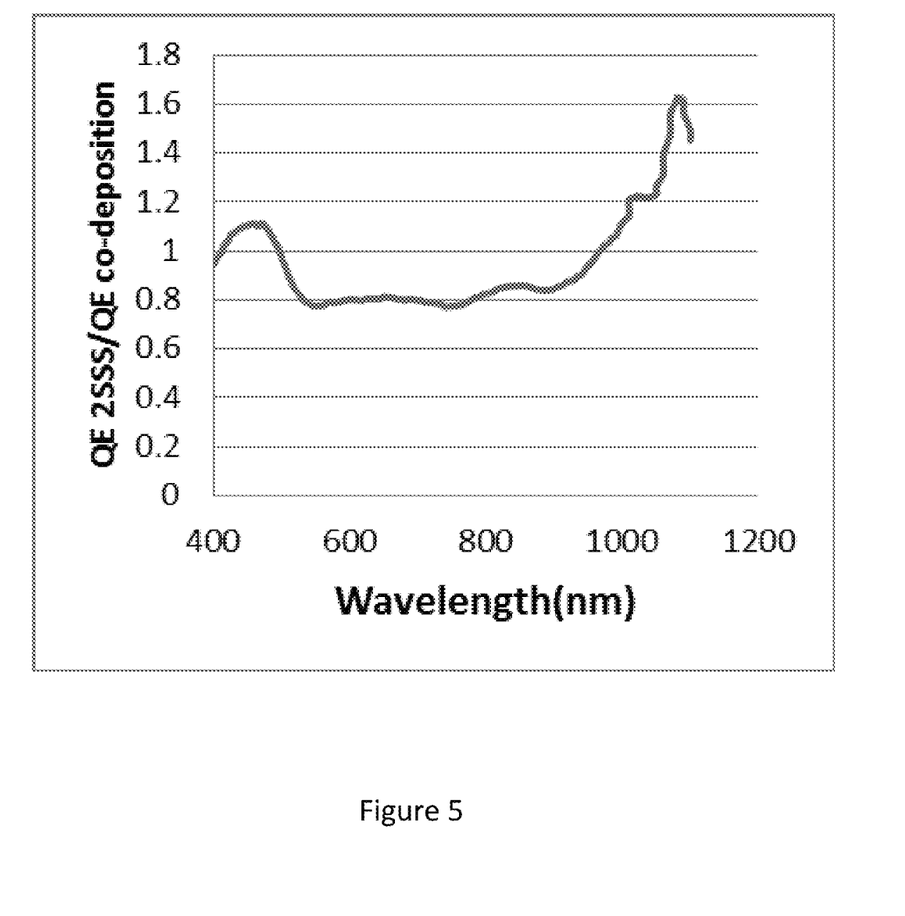
FIG. 5 is an illustration of comparison of the quantum efficiency of devices made with the novel 2SSS process with that of devices made by co-deposition.

To address issue 1, devices have been produced using laboratory scale deposition systems. In this case deposition of the metals as well as the Se flux is done by evaporation using effusion cells. While sputtering is the preferred method for deposition of the metals in a manufacturing environment because of the established capabilities of large area sputtering, for laboratory scale demonstration of device performance in small areas this capability is not required. To simulate the 2-step sequential deposition process described above shutters are used to alternate exposure of the substrate to metal fluxes and Se fluxes. This enables the layer by layer buildup of the absorber film. As discussed in further detail below, for a 2-step process we have established that films with the same properties of composition and structure to co-deposited films can be made with the 2SSS process. To further our demonstration of the quality of these films, devices have also been made and evaluated. As a comparison we made devices in the following manner. In the first step, the Cu-rich CuGaSe layer was made by depositing multiple thin layers by 2SSS. In the second step, the CuGaIn layer was deposited by co-deposition. As a baseline another device was made by the same 2-step process but both steps were done by conventional co-deposition. Total film thickness in each case was about 2 microns. Both films were finished into devices using chemical bath deposition of CdS followed by sputter deposition of a ZnO buffer layer followed by a ZnO:Al transparent conducting layer. Measurement of IV curves of several devices of each in a solar simulator indicated comparable performance of Voc's of about 530 mV and Jsc's of about 31 mA/cm$^2$. Since the devices were just made for comparison purposes, no attempt was made to optimize the device formation steps. We have found measurements of Jsc and Voc to suffice as indicators of performance. No grids were deposited and consequently the fill factor is not accurate. Under similar processing with other devices we observe fill factors in the 0.70-0.75 range. As such these devices would have efficiency of order 12%. Since the entire film growth is different under 2SSS processing performance parameters such as Jsc that are dependent upon bulk properties are good indicators of changes in electronic properties. A more sensitive probe of these properties is the EQE, external quantum efficiency. EQE spectra were taken for both types of devices and compared by plotting the ratios. FIG. 5 shows the co-deposition device is more efficient in the mid spectral range, while the 2SSS device is more efficient in the blue and red regions. These differences have their origins in the underlying operation of the devices, but it can be seen that the overall performance of the 2SSS device is comparable to the standard co-deposition device. Furthermore, the small differences can be improved by further tuning of the 2SSS process together with the device formation steps. While sputtering is the preferred method of deposition for the metals, the 2SSS process can be applied with other deposition technologies as well. An example is deposition of the metals by evaporation as was done in these laboratory experiments. This reduces the difficulty of the co-deposition process which is based upon simultaneous fluxes of metals and Se reaching the substrate. While this is not a difficulty in a laboratory-scale deposition system, it is at the manufacturing level in which this needs to be accomplished over large areas. With all evaporation based 2SSS processing the sequential process of metal layer deposition followed by selenization uncouples the sources allowing for more facile placement to accomplish large area uniformity. Another variation of this process would include selenization in a close space sublimation mode. Vapor transport is another deposition technology with commercial potential. It could be utilized to deposit the metals. Again suitable confinement of the processing fluxes would be utilized to prevent cross contamination with the selenization chamber.

The key attributes of this process are as follows:

Metals are deposited by commercially viable deposition technologies, preferably by sputtering;

Selenization of the metal layers is provided in subsequent locations by large area sources that are separated from the metal sources using constructs that prevent cross contamination of the sources and different processing conditions in the metal and selenization chambers; this enables the metals to be deposited under different pressure than that in the selenization chamber.

The process consists of several sequential steps of metal deposition followed by selenization. The number of steps is determined by the targeted total thickness and the most effective thickness of each metal/selenization sequence that optimizes throughput and performance. The thickness of each metal layer is determined by the speed of movement of the substrate and the deposition rate;

The process, as illustrated in FIG. 1, shows a configuration for a 2-step process. The Cu-rich CuGaSe first step is accomplished in the upper chambers, and the CIGS second step is accomplished in the lower chambers. As illustrated the metal/selenization steps are repeated for each step until the desired thickness is reached. In an actual system the chambers would all be connected in series, typically in a line. In this approach the substrate moves continuously through the system with each area going through a given metal/selenization zone only once. In a variation of this process the substrate could be moved back and forth between metal/selenization zones until the desired thickness is reached.

There are three key factors that will determine the commercial success of this approach:
1. The deposition rate/performance trade-off;
2. The metal layer thickness/performance trade-off; and
3. The cost of the deposition unit.

Since metals can be sputtered at high rates, factor 1 will be determined by the selenization rate. It is expected that this will be determined by thermodynamics since evaporation sources provide an abundance of Se. Factors 1 and 2 are not independent of each other. The thicker the layer that can be successfully selenized, the fewer the passes that are required. While this will determine the overall system size and configuration, the rate of selenization is still the key variable in determining throughput.

Figure 2:
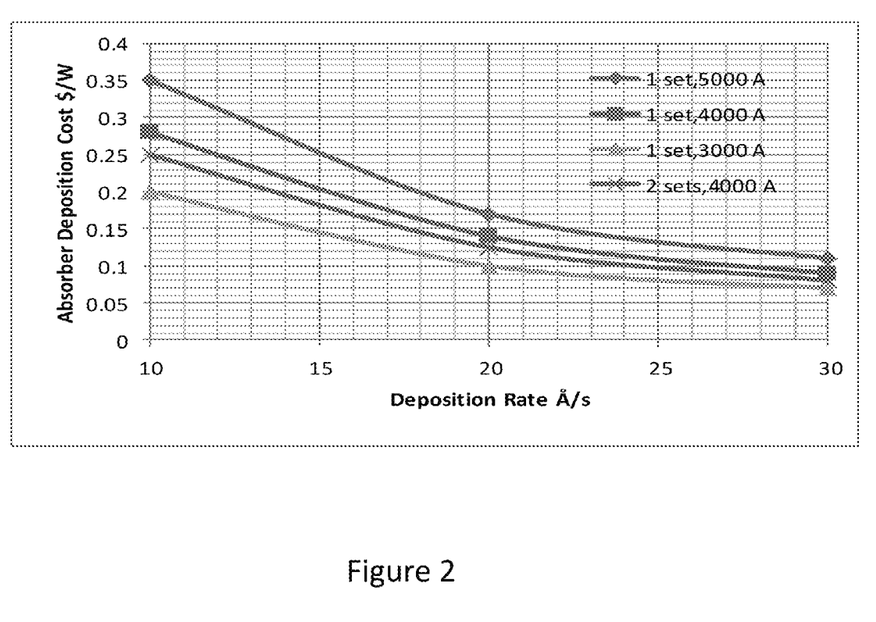
FIG. 2 is an illustration of the capital cost for the CIGS layer.

A simple model was devised to approximate the cost of capital for the absorber deposition with results shown in FIG. 2. Key parameters are the deposition rate, the total metal layer thickness and the cost of a metal/selenization deposition zone. Results are plotted for metal layer thicknesses of 3000 Å, 4000 Å and 5000 Å. The cost of a deposition zone is assumed to be $250K. For a deposition thickness of 4000 Å a second curve is shown for the case of having two sets of deposition sources in each deposition zone. As can be seen, the capital cost can be $0.10/W or less which is in the acceptable range for an overall module cost of $0.50/W. Thickness of the individual layers also becomes a driver of the system configuration. As this thickness is lowered, more deposition zones are needed. However, adding deposition zones also increases throughput as the substrate is moved faster, so on balance the capital cost is not a function of the total number of zones.

The present invention allows extensive profiling of the constituents. The 3-step co-deposition process which has produced world record efficiencies can easily be reproduced using this approach.

Example

Control of Film Stoichiometry

Figure 3:
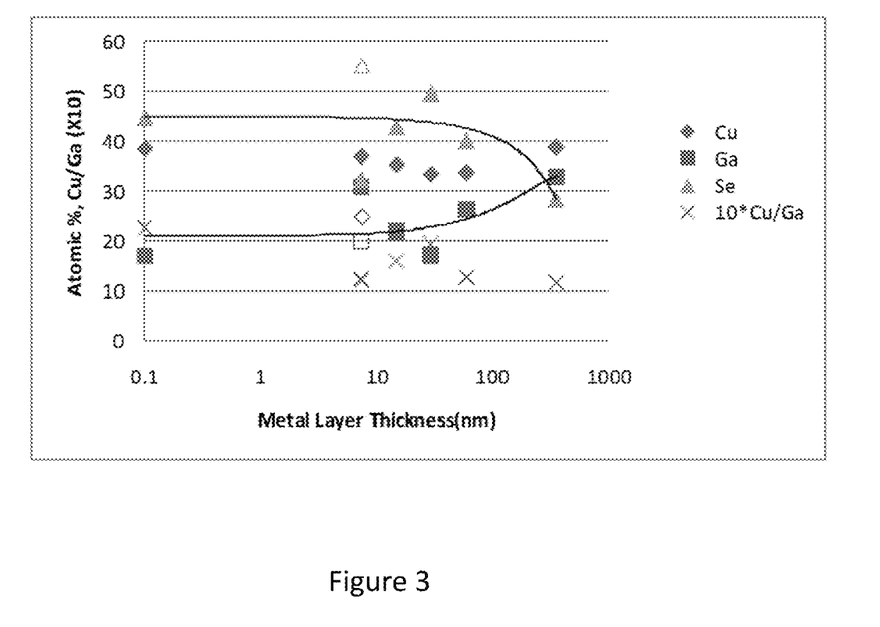
FIG. 3 is an illustration of CGS film composition as a function of deposited metal layer thickness.

In FIG. 3 compositional data is provided for the CGS layer in a 2-step process. The data was attained by depositing the same total metal thickness in steps of 6, 12, 25 and 50 cycles of the metal layer deposition/Selenization sequence, which results in corresponding individual metal layer thicknesses of 59.2, 29.6, 14.8 and 7.4 nm respectively. The atomic composition as well as the Cu/Ga (X10) ratio is plotted at each thickness. The deposition rates and conditions were identical for these runs with the exception of the open symbols. Composition was measured by Energy Dispersive Spectroscopy (EDS). The data points on the y axis are for a co-deposited film which would have a metal layer thickness of zero for comparison with the 2SSS films. A value of 0.1 was chosen to allow plotting the data on a log scale. The data points at metal layer thickness of 355 nm represent the other endpoint in which the entire metal layer thickness is deposited as one layer and then selenized. Thus the two endpoints represent the known and practiced deposition technologies, while the center points are the 2SSS process.

Since Cu compounds are not known to be volatile, the Cu content is readily controlled by maintaining the deposition rate. The Cu level is nearly independent of the metal layer thickness, as shown in FIG. 3. In co-deposition the elemental species all arrive on the growth surface together and have nearly uninhibited access to each other. Growth is then expected to be driven primarily by thermodynamics, although some component of surface migration could be operative. In the case of the layered films, compound formation is primarily on the surface. In such a case bulk kinetics or diffusion also plays a role. Therefore, as the metal layers are made thinner, the diffusion contribution is decreasing. Thus as the thickness of the metal layers is reduced, film formation should approach that of co-deposition, as shown in FIG. 3. The trend lines shown for Ga and Se asymptote toward the data for co-deposition.

At the 355 nm thick endpoint, all of the metal is deposited in a single layer, and the layer needs to be selenized with the same total Se flux as that used for the co-deposited films. The Selenization level is below 30% indicating poor compound formation. The Ga level on the other hand is high because a lot of the Ga has not diffused to the growth surface and been Selenized to form the desired $Ga_2Se_3$ binary. At the same time, this also reduced formation of $Ga_2Se$ which would have removed Ga. Therefore, under the deposition conditions used the Ga level before any loss might be expected to be about 35%. As the metal layers become thinner, the Ga level diminishes and the Se level increases, indicating greater reactivity and formation of both $Ga_2Se_3$ and $Ga_2Se$. The trend lines indicate the expected continuation of this process. However, at the metal layer thickness of 29.2 nm the Ga composition starts to rise again, and the Se starts to drop. This means that diffusion is no longer dominant, but rather compound formation is limited by Se availability. The total Se flux has not changed, but the exposure time of each metal layer to this flux is reduced. Thus in this region both diffusion and thermodynamics are operative. To counter this in another experiment Se flux was increased by about 30% for the metal layer thickness of 7.4 nm. The results are shown as open symbols. It can be seen that Ga content drops and the Se content increases indicating a much higher level of Selenization.

Figure 4:
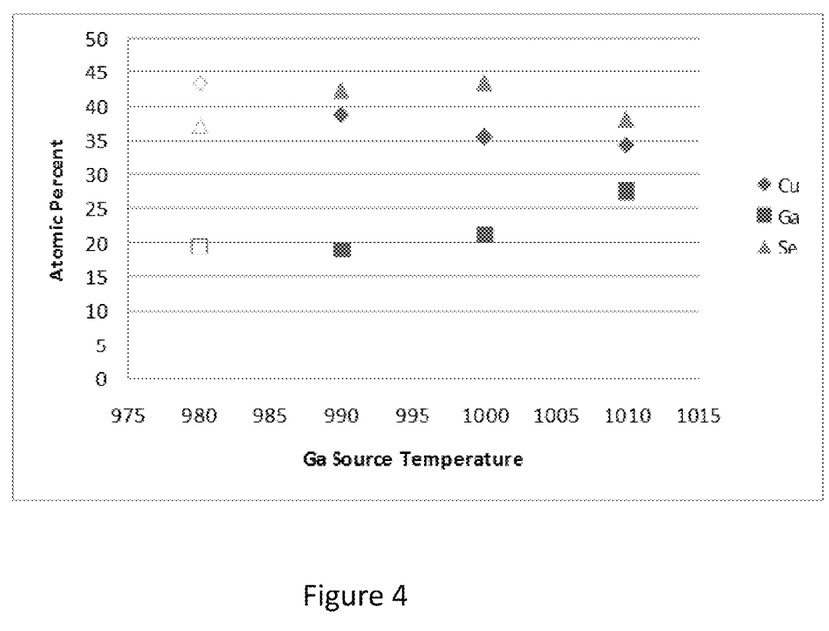
FIG. 4 is an illustration of CGS composition as a function of Ga source temperature.

The Ga—Se interaction was further tested in another series of samples. The samples were made at a metal layer thickness of 7.4 nm under similar conditions to those in FIG. 3. In this case the parameter that was varied was the deposition rate of Ga by varying the Ga source temperature. The starting point was a source temperature of 1010° C. which is the same as that used for the data of FIG. 3. The temperature was then lowered to observe the effect of decreased Ga flux. The results are shown in FIG. 4. As the Ga flux dropped there was a corresponding drop in incorporated Ga, and a concomitant increase in Se incorporation. This implies that some Ga at the 1010° C. flux level is unselenized, but the Se flux is sufficient to selenize a lesser amount of Ga produced by lowering the Ga source temperature. For the data point at 980° C. the Se flux level was lowered by 25%. This resulted in somewhat higher Ga incorporation even though the Ga flux was lowered. This indicates that Ga composition can be managed by judicious selection of the selenization time and flux. In summary, the data indicates that films with good stoichiometry can be produced by the 2SSS method. While films with lower and higher metal layer thicknesses could require more Se than co-deposited films, films with metal layer thickness in the vicinity of 30 nm can be effectively selenized with the same total amount of Se flux as co-deposited films. Practice of this invention would focus on this region for this layer. As seen in FIG. 3, the Cu/Ga level for the film at metal thickness of 29.2 nm is about 2. For other desired values of this ratio the Cu flux can be changed.

The two overriding aspects of film structure are formation of the proper compounds and the grain size. The predominant XRD peaks for films co-deposited at 300° C. are $2\theta = 37°-38°$, $27°-28°$ and $44°-45°$. The best fit to these are the binaries $\gamma$-$Ga_2Se_3$, $Cu_3Se_2$, and $Cu_3Se_2$ respectively. Grain sizes are of order 0.5 μm. This structure is generally seen in the 2SSS films. Having established that both composition and structure is comparable in the CGS layer, we then extended our investigation of these properties in the completed film. This involved deposition of a second layer containing In on top of the first layer using the same 2SSS processing steps as the CGS layer. The two layer stack is then heated to above 500° C. to form the final film. EDS data and XRD data again indicated that composition and structure comparable to co-deposition films was being attained in the completed 2SSS absorber layers.

It will be seen that the advantages set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. A method of forming an absorber layer of copper indium gallium diselenide (CIGS) solar modules, comprising the steps of:
   (a) providing a substrate or superstrate;
   (b) preheating the substrate or superstrate to a first predetermined temperature;
   (c) depositing onto the substrate or superstrate a first layer containing Cu and Ga in absence of Se and In;
   (d) exposing the first layer to Se;
   (e) repeating steps (c) and (d) until the first layer attains a first predetermined thickness;
   (f) heating the substrate or superstrate to a second predetermined temperature, the second predetermined temperature being higher than the first predetermined temperature;
   (g) depositing onto the substrate or superstrate a second layer containing Cu, In, and Ga in absence of Se;
   (h) exposing the second layer to Se; and
   (i) repeating steps (g) and (h) until the second layer attains a second predetermined thickness.

2. The method of claim 1, further comprising steps (c) and (d) being performed in separate deposition zones to control cross contamination.

3. The method of claim 2, further comprising the deposition zones being connected in series.

4. The method of claim 2, further comprising the substrate or superstrate being transported across the deposition zones until the first predetermined thickness is attained.

5. The method of claim 1, further comprising maintaining the substrate or superstrate at the first predetermined temperature during steps (c) and (d), and maintaining the substrate or superstrate at the second predetermined temperature during steps (g) and (h).

6. The method of claim 1 further comprising first predetermined temperature about 275° C. or about 300° C., and the second predetermined temperature being about 530° C. or about 550° C.

7. The method of claims 1, further comprising the first and the second layers being deposited by sputtering.

8. The method of claims 1, further comprising the first and the second layers being deposited by an evaporation process.

9. The method of claims 1, further comprising Se being deposited by an evaporation process.

10. The method of claim 1, further comprising a step (j) of subjecting the substrate or superstrate to a predetermined temperature profile.

11. The method of claim 10, further comprising exposing the substrate or superstrate to a Se flux during step (j).

12. The method of claim 1, further comprising depositing a third layer onto the substrate or superstrate to form a junction and an electrode.

13. The method of claim 12, further comprising the third layer being of CdS or ZnO.

* * * * *